(12) United States Patent
Wu et al.

(10) Patent No.: US 12,176,434 B2
(45) Date of Patent: Dec. 24, 2024

(54) STRAINED SEMICONDUCTOR FET DEVICES WITH EPITAXIAL QUALITY IMPROVEMENT

(71) Applicant: International Business Machines Corporation, Armonk, NY (US)

(72) Inventors: Heng Wu, Guilderland, NY (US); Ruilong Xie, Niskayuna, NY (US); Alexander Reznicek, Troy, NY (US); Lan Yu, Voorheesville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/920,721

(22) Filed: Jul. 5, 2020

(65) Prior Publication Data
US 2022/0005951 A1 Jan. 6, 2022

(51) Int. Cl.
*H01L 29/78* (2006.01)
*H01L 21/02* (2006.01)
*H01L 29/06* (2006.01)
*H01L 29/165* (2006.01)
*H01L 29/267* (2006.01)
*H01L 29/32* (2006.01)
*H01L 29/423* (2006.01)
*H01L 29/66* (2006.01)
*H01L 29/786* (2006.01)

(52) U.S. Cl.
CPC .... *H01L 29/7848* (2013.01); *H01L 21/02532* (2013.01); *H01L 21/02603* (2013.01); *H01L 29/0673* (2013.01); *H01L 29/165* (2013.01); *H01L 29/267* (2013.01); *H01L 29/32* (2013.01); *H01L 29/42392* (2013.01); *H01L 29/66545* (2013.01); *H01L 29/66553* (2013.01); *H01L 29/66742* (2013.01); *H01L 29/78618* (2013.01); *H01L 29/78696* (2013.01)

(58) Field of Classification Search
CPC . H01L 21/762; H01L 27/092; H01L 29/7848; H01L 29/66545; H01L 21/3065; H01L 21/30604; H01L 29/0665
See application file for complete search history.

(56) References Cited

U.S. PATENT DOCUMENTS

| | | |
|---|---|---|
| 9,799,748 B1 | 10/2017 | Xie et al. |
| 9,831,323 B2 | 11/2017 | Kittl et al. |
| 9,871,140 B1 | 1/2018 | Balakrishnan et al. |
| 9,941,405 B2 | 4/2018 | Kittl et al. |
| 10,211,307 B2 | 2/2019 | Ching et al. |

(Continued)

*Primary Examiner* — Brian Turner
(74) *Attorney, Agent, or Firm* — Edward J. Wixted, III

(57) ABSTRACT

Strained semiconductor FET devices with epitaxial quality improvement are provided. In one aspect, a semiconductor FET device includes: a substrate; at least one device stack including active layers oriented horizontally one on top of another on the substrate; gates surrounding at least a portion of each of the active layers; gate spacers alongside the gates; and source/drains, interconnected by the active layers, on opposite sides of the gates, wherein the source/drains are offset from the gates by inner spacers, wherein the source/drains include an epitaxial material having a low defect density which induces strain in the active layers, and wherein the gate spacers are formed from a same material as the inner spacers. A method of forming the semiconductor FET device using a spacer last process is also provided.

12 Claims, 15 Drawing Sheets

A-A'

(56) References Cited

U.S. PATENT DOCUMENTS

| | | |
|---|---|---|
| 10,243,060 B2 | 3/2019 | Chao et al. |
| 2008/0064149 A1* | 3/2008 | Cohen .................. H01L 29/785 |
| | | 257/E21.442 |
| 2011/0318893 A1* | 12/2011 | Lochtefeld ........ H01L 29/78687 |
| | | 438/268 |
| 2017/0213911 A1* | 7/2017 | Balakrishnan ...... H01L 29/7848 |
| 2017/0256611 A1* | 9/2017 | Kim ...................... H01L 29/775 |
| 2017/0271514 A1* | 9/2017 | Kittl .................... H01L 29/7848 |
| 2017/0345946 A1* | 11/2017 | Lee .................. H01L 29/78696 |
| 2018/0047832 A1* | 2/2018 | Tapily .................. H01L 29/785 |
| 2018/0175166 A1* | 6/2018 | Reboh ................ H01L 29/6656 |
| 2018/0277656 A1 | 9/2018 | Chao et al. |
| 2018/0301564 A1* | 10/2018 | Kwon .............. H01L 29/78696 |
| 2018/0350985 A1* | 12/2018 | Dasgupta ............ H01L 27/0924 |
| 2019/0027570 A1 | 1/2019 | Ching et al. |
| 2019/0123163 A1* | 4/2019 | Yang ................ H01L 21/02603 |
| 2019/0237559 A1* | 8/2019 | Cheng ................ H01L 29/0653 |
| 2021/0035870 A1* | 2/2021 | Young ............. H01L 21/823814 |
| 2021/0066490 A1* | 3/2021 | Yang ................ H01L 29/66439 |
| 2021/0167059 A1* | 6/2021 | Lee .................. H01L 29/66545 |
| 2021/0183707 A1* | 6/2021 | Ng ........................ H01L 29/785 |
| 2021/0280673 A1* | 9/2021 | Gocho ............. H01L 29/66545 |
| 2021/0320210 A1* | 10/2021 | Lin .................. H01L 21/02603 |

* cited by examiner

A-A'

A-A'

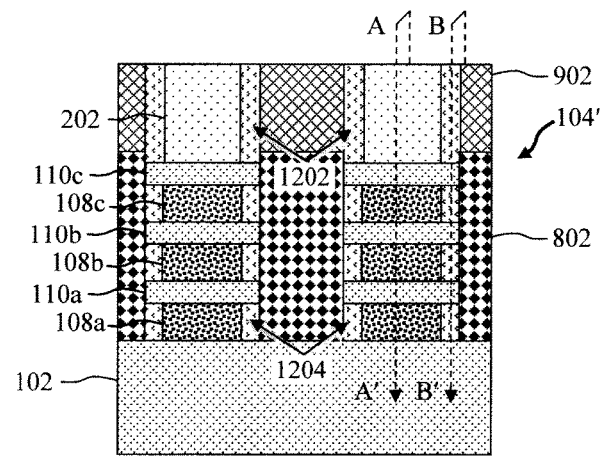
FIG. 13A
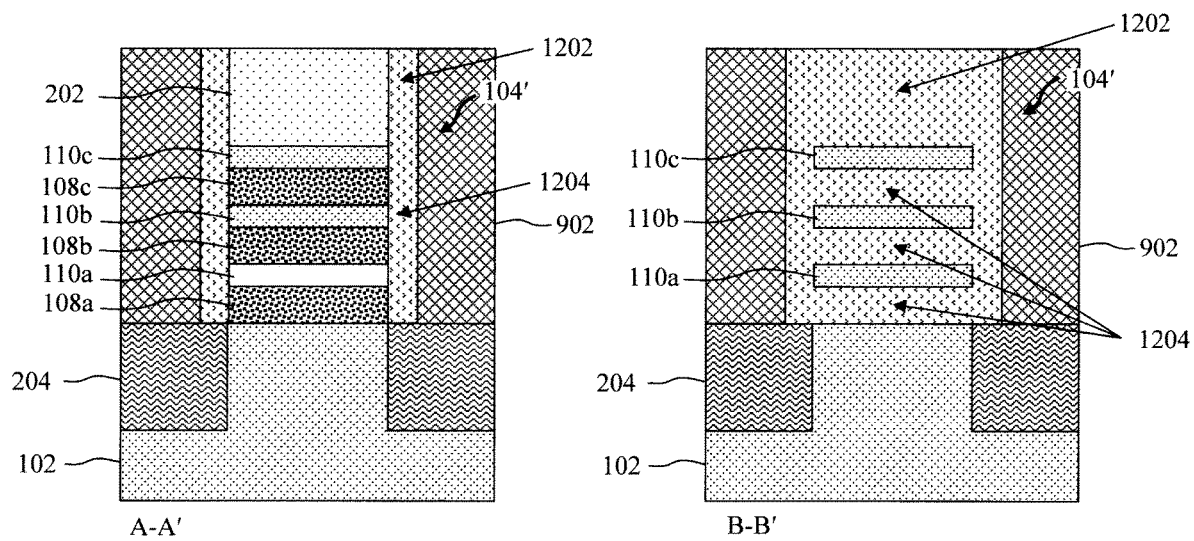
FIG. 13B
FIG. 13C

STRAINED SEMICONDUCTOR FET DEVICES WITH EPITAXIAL QUALITY IMPROVEMENT

FIELD OF THE INVENTION

The present invention relates to source/drain epitaxy in semiconductor field-effect transistor (FET) devices, and more particularly, to strained semiconductor FET devices with epitaxial quality improvement and techniques for formation thereof using a spacer-last process.

BACKGROUND OF THE INVENTION

A stacked nanosheet architecture is a promising design choice for the next generation of field-effect transistors (FETs). Advantageously, a nanosheet FET design enables the formation of gate-all-around or GAA configurations. With conventional process flows for nanosheet FET fabrication, inner spacers are formed along the nanosheet stack prior to source and drain growth. These inner spacers limit growth of the source and drain epitaxy to the ends of the channel nanosheets.

However, it is difficult to grow the source and drain epitaxy with the inner spacers already in place. This is due to the small exposed area at the ends of the channel nanosheets. Further, due to the different angle of epitaxy nucleation, the defectivity in the source and drain epitaxy is high and thus there is almost no strain generated by the epitaxial material.

Therefore, improved techniques for fabricating nanosheet FET devices would be desirable.

SUMMARY OF THE INVENTION

The present invention provides strained semiconductor field-effect transistor (FET) devices with epitaxial quality improvement and techniques for formation thereof using a spacer last process. In one aspect of the invention, a semiconductor FET device is provided. The semiconductor FET device includes: a substrate; at least one device stack including active layers oriented horizontally one on top of another on the substrate; gates surrounding at least a portion of each of the active layers; gate spacers alongside the gates; and source/drains, interconnected by the active layers, on opposite sides of the gates, wherein the source/drains are offset from the gates by inner spacers, wherein the source/drains include an epitaxial material having a low defect density which induces strain in the active layers, and wherein the gate spacers are formed from a same material as the inner spacers.

In another aspect of the invention, a method of forming a semiconductor FET device is provided. The method includes: forming at least one device stack including alternating sacrificial layers and active layers oriented horizontally one on top of another on a substrate; patterning trenches in the at least one device stack; recessing the sacrificial layers to form pockets along sidewalls of the trenches; growing a sacrificial semiconductor material in the pockets whereby, following the growing, the active layers and the sacrificial semiconductor material are present along sidewalls of the trenches; forming source/drains in the trenches alongside the active layers and the sacrificial semiconductor material, wherein the source/drains include an epitaxial material having a low defect density which induces strain in the active layers; selectively removing the sacrificial semiconductor material forming divots alongside the sacrificial layers; forming inner spacers in the divots; removing the sacrificial layers; and forming gates surrounding at least a portion of each of the active layers.

A more complete understanding of the present invention, as well as further features and advantages of the present invention, will be obtained by reference to the following detailed description and drawings.

BRIEF DESCRIPTION OF THE DRAWINGS

FIG. 13A is a cross-sectional diagram illustrating the spacer material having been planarized, FIG. 13B is a cross-sectional diagram illustrating the spacer material having been planarized from a perpendicular cut A-A' through the structure of FIG. 13A, and FIG. 13C is a cross-sectional diagram illustrating the spacer material having been planarized from a perpendicular cut B-B' through the structure of FIG. 13A according to an embodiment of the present invention;

DETAILED DESCRIPTION OF PREFERRED EMBODIMENTS

As provided above, nanosheet field-effect transistor (FET) device fabrication process flows where inner spacers are formed along the nanosheet stack prior to source and drain growth can present some notable drawbacks. For instance, there is only a small exposed area at the ends of the channel nanosheets for the source and drain epitaxy which makes the epitaxial growth process difficult.

Furthermore, the defectivity in the resulting source and drain epitaxy is high based on the different angle of epitaxy nucleation on the exposed ends of the channel nanosheets. With a high defectivity, there is almost no channel strain generated by the epitaxial material. Channel strain desirably enhances channel mobility and overall device performance.

Advantageously, provided herein are techniques for fabricating semiconductor FET devices such as nanosheet FET devices whereby the inner spacers are formed post epitaxial source/drain growth. By enabling the source/drain growth to occur before the inner spacer formation, better epitaxial quality and strain introduction can be achieved. Namely, the absence of the (inner spacer) dielectric material and in turn the presence of a semiconductor material along the sidewall of the nanosheet stack leads to low defect density and hence strained epitaxy. As will be described in detail below, a replacement spacer process is employed in accordance with the present techniques whereby a sacrificial spacer and sacrificial high Ge content SiGe growth are employed prior to source/drain formation. Following source/drain formation, these sacrificial structures are removed and replaced with the final dielectric spacers of the semiconductor FET device. Hence, this process may also be referred to herein as a 'spacer-last' process. The term 'sacrificial' as used herein refers to a structure that is removed, in whole or in part, during fabrication of the semiconductor FET device.

Figure 1:
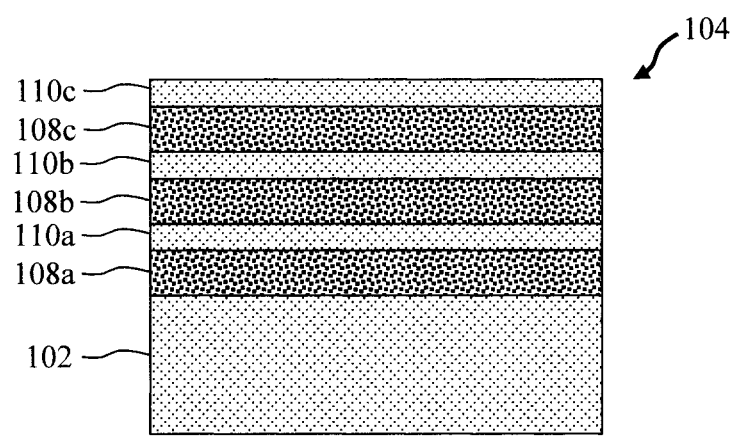
FIG. 1 is a cross-sectional diagram illustrating a stack of sacrificial and active layers having been formed on a substrate according to an embodiment of the present invention.

An exemplary methodology for forming a semiconductor FET device in accordance with the present techniques is now described by way of reference to FIGS. 1-15. As shown in FIG. 1, the process begins with the formation of a stack 104 of sacrificial and active layers on a substrate 102.

According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX.

The SOI layer can include any suitable semiconductor, such as Si, Ge, SiGe, and/or a III-V semiconductor. Substrate 102 may already have pre-built structures (not shown) such as transistors, diodes, capacitors, resistors, interconnects, wiring, etc.

According to an exemplary embodiment, formation of stack 104 involves first depositing sacrificial and active layers, stacked vertically one on top of another on substrate 102. By way of example only, in one exemplary embodiment, the sacrificial and active layers are nanosheets that are formed as a stack on substrate 102. The term 'nanosheet,' as used herein, generally refers to a sheet or a layer having nanoscale dimensions. Further, the term 'nanosheet' is meant to encompass other nanoscale structures such as nanowires. For instance, the term 'nanosheet' can refer to a nanowire with a larger width, and/or the term 'nanowire' can refer to a nanosheet with a smaller width, and vice versa.

As shown in FIG. 1, stack 104 specifically includes alternating layers of sacrificial layers 108a,b,c, etc. and active layers 110a,b,c, etc. deposited on substrate 102. As provided above, the term 'sacrificial' refers to a structure that is removed, in whole or in part, during fabrication of the semiconductor FET device. By contrast, active layers active layers 110a,b,c, etc. will remain in place and serve as channels of the semiconductor FET device. It is notable that the number of sacrificial layers 108a,b,c, etc. and active layers 110a,b,c, etc. shown in the figures is provided merely as an example to illustrate the present techniques. For instance, embodiments are contemplated herein where more or fewer sacrificial layers 108a,b,c, etc. and/or more or fewer active layers 110a,b,c, etc. are present than is shown.

According to an exemplary embodiment, each of the sacrificial layers 108a,b,c, etc. and the active layers 110a,b,c, etc. are deposited/formed on substrate 102 using an epitaxial growth process. In one exemplary embodiment, the sacrificial layers 108a,b,c, etc. and the active layers 110a,b,c, etc. each have a thickness of from about 10 nanometers (nm) to about 25 nm and ranges therebetween.

The materials employed for sacrificial layers 108a,b,c, etc. and active layers 110a,b,c, etc. are such that the sacrificial layers 108a,b,c, etc. can be removed selective to the active layers 110a,b,c, etc. during fabrication (see below). For instance, according to an exemplary embodiment, sacrificial layers 108a,b,c, etc. are each formed from SiGe, while active layers 110a,b,c, etc. are each formed from Si. Etchants such as wet hot SC1, vapor phase hydrogen chloride (HCl), vapor phase chlorine trifluoride ($ClF_3$) and other reactive clean processes (RCP) are selective for etching of SiGe versus Si.

Further, as highlighted above, sacrificial high Ge content SiGe is employed during source/drain formation. For instance, in one exemplary embodiment, a high Ge content SiGe is SiGe having from about 50% Ge to about 100% Ge (i.e., pure Ge) and ranges therebetween. For instance, in one non-limiting example, the sacrificial high Ge content SiGe is formed from SiGe60 (which is SiGe having a Ge content of about 60%). Following source/drain formation, this sacrificial high Ge content SiGe needs to be removed using a selective etch and replaced with the inner spacers of the semiconductor FET device. By way of example only, high Ge content SiGe can be removed selective to low Ge content SiGe using an etchant such as dry HCl. In that case, sacrificial layers 108a,b,c, etc. are preferably formed from a low Ge content SiGe. For instance, in one exemplary embodiment, a low Ge content SiGe is SiGe having from about 20% Ge to about 50% Ge and ranges therebetween. For instance, in one non-limiting example, sacrificial layers 108a,b,c, etc. are formed from SiGe30 (which is SiGe having a Ge content of about 30%).

Figure 2A:
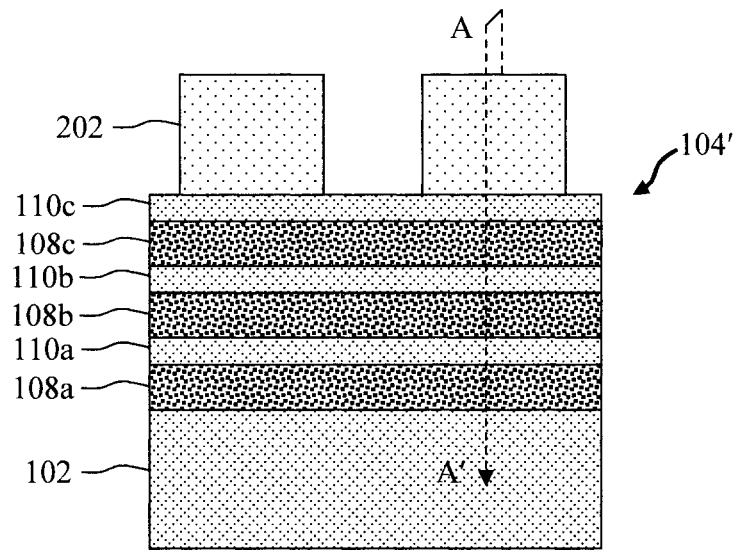
FIG. 2A is a cross-sectional diagram illustrating the sacrificial and active layers having been patterned into at least one device stack, and sacrificial gates having been formed on the device stack.
Figure 2B:
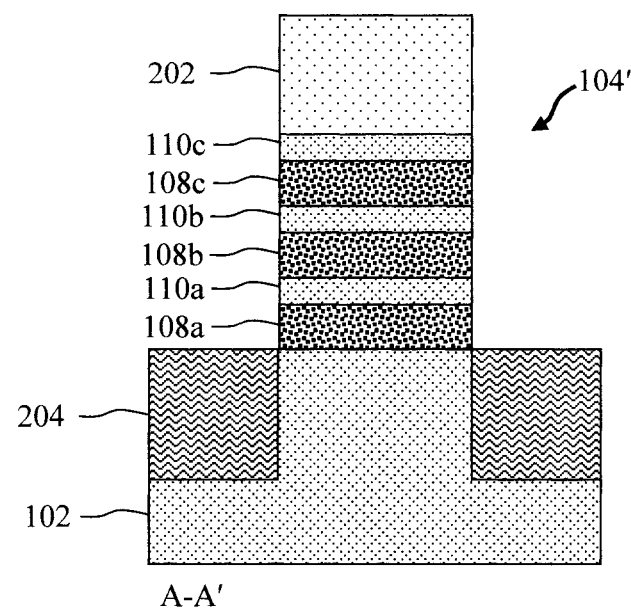
FIG. 2B is a cross-sectional diagram illustrating the sacrificial and active layers having been patterned into the at least one device stack, the sacrificial gates having been formed on the device stack, and shallow trench isolation (STI) regions having been formed in the substrate at the base of the device stack from a perpendicular cut A-A' through the structure of FIG. 2A according to an embodiment of the present invention.

The sacrificial layers 108a,b,c, etc. and the active layers 110a,b,c, etc. are then patterned into at least one individual device stack 104', and sacrificial gates 202 are formed on the device stack 104'. See FIG. 2A and FIG. 2B. FIG. 2B depicts a cut along line A-A' through the structure shown in FIG. 2A. As shown in FIG. 2A, the cut along line A-A' is oriented into and out of the page (i.e., perpendicular to the view depicted in FIG. 2A).

Standard lithography and etching techniques can be employed to pattern the sacrificial layers 108a,b,c, etc. and the active layers 110a,b,c, etc into device stack 104'. With standard lithography and etching processes, a lithographic stack (not shown), e.g., photoresist/organic planarizing layer (OPL)/anti-reflective coating (ARC), is used to pattern a hardmask (not shown) with the footprint and location of the device stack 104'. Suitable hardmask materials include, but are not limited to, nitride hardmask materials such as silicon nitride (SiN), silicon oxynitride (SiON), silicon carbide nitride (SiCN), and/or oxide hardmask materials such as silicon oxide (SiOx). Alternatively, the hardmask can be formed by other suitable techniques, including but not limited to, sidewall image transfer (SIT), self-aligned double patterning (SADP), self-aligned quadruple patterning (SAQP), and other self-aligned multiple patterning (SAMP). An etch is then used to transfer the pattern from the hardmask to the underlying stack of sacrificial and active layers. A directional (anisotropic) etching process such as reactive ion etching (RIE) can be employed for the stack etch.

Shallow trench isolation (STI) regions 204 (visible in FIG. 2B) are then formed in the substrate 102 at the base of the device stack 104'. The process to form STI regions 204 generally includes patterning trenches in the substrate 102, and then filling the trenches with a dielectric such as an oxide (which may also be referred to herein as an 'STI oxide'). Although not explicitly shown in the figures, a liner (e.g., a thermal oxide or silicon nitride (SiN)) may be deposited into the trenches prior to the STI oxide. Suitable STI oxides include, but are not limited to, oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as chemical vapor deposition (CVD), atomic layer deposition (ALD), or physical vapor deposition (PVD) can be used to deposit the STI oxide, after which the STI oxide is planarized using a process such as chemical mechanical polishing (CMP). After that, the STI oxide is recessed using a dry or wet etch process to reveal the device stack 104'.

The sacrificial gates 202 are then formed on the device stack 104' over channel regions of the semiconductor FET device. To form sacrificial gates 202, a sacrificial gate material is first blanket deposited over the device stack 104'. Suitable sacrificial gate materials include, but are not limited to, poly-silicon (poly-Si) and/or amorphous silicon (a-Si). A process such as CVD, ALD or PVD can be employed to deposit the sacrificial gate material over the device stack 104'. According to an exemplary embodiment, a thin (e.g., from about 1 nanometer (nm) to about 3 nm) layer of silicon oxide (SiOx) is first formed on the device stack 104', followed by the poly-Si and/or a-Si. Standard lithography and etching techniques (see above) are then employed to pattern the sacrificial gate material into the individual sacrificial gates 202 shown in FIG. 2A and FIG. 2B. A directional (anisotropic) etching process such as RIE can be employed for the sacrificial gate etch.

Sacrificial gates 202 will serve as a placeholder for the final gates of the semiconductor FET device. Specifically, sacrificial gates 202 will be removed later on in the process and replaced with metal gate stacks that will serve as the final gates of the semiconductor FET device. Thus, these final gates of the semiconductor FET device are also referred to herein as "replacement metal gates" or simply "RMG." Use of a replacement metal gate process is advantageous because it prevents exposure of the metal gate stack materials to potentially damaging conditions during subsequent processing steps. For instance, the high-κ dielectrics used in the replacement metal gate stacks can be damaged by exposure to high temperatures. Thus, these gate stack materials are only placed near the end of the process.

Figure 3A:
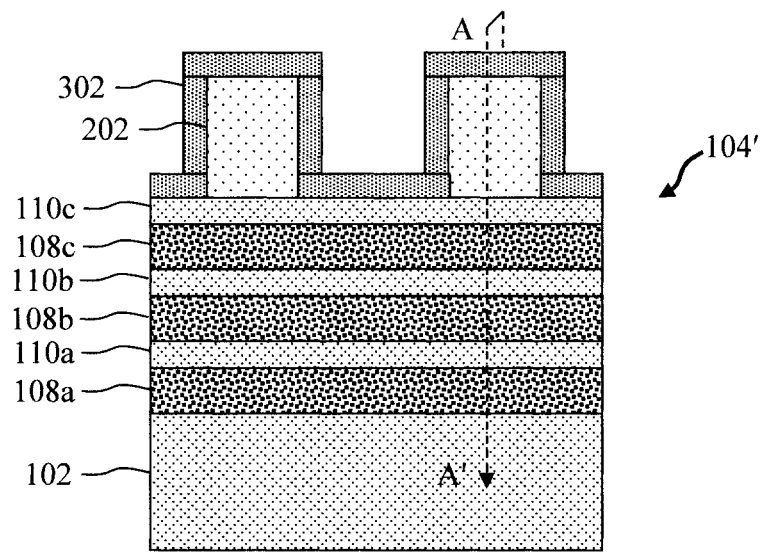
FIG. 3A is a cross-sectional diagram illustrating a sacrificial spacer having been deposited onto the device stack over the sacrificial gates.
Figure 3B:
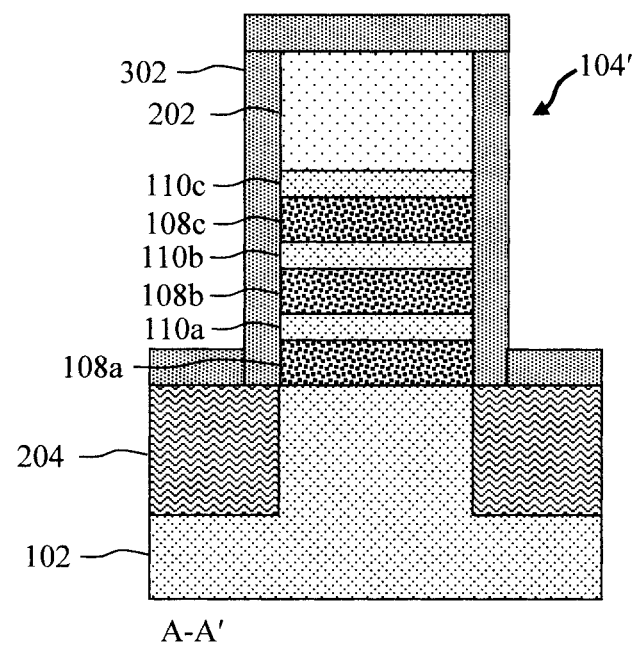
FIG. 3B is a cross-sectional diagram illustrating the sacrificial spacer having been deposited onto the device stack over the sacrificial gates from a perpendicular cut A-A' through the structure of FIG. 3A according to an embodiment of the present invention.

A sacrificial spacer 302 is then deposited onto the device stack 104' over the sacrificial gates 202. See FIG. 3A and FIG. 3B. FIG. 3B depicts a cut along line A-A' through the structure shown in FIG. 3A. As shown in FIG. 3A, the cut along line A-A' is oriented into and out of the page (i.e., perpendicular to the view depicted in FIG. 3A). Suitable materials for sacrificial spacer 302 include, but are not limited to, nitride materials such as silicon nitride (SiN), silicon oxynitride (SiON) and/or silicon carbide nitride (SiCN). A process such as CVD, ALD or PVD can be employed to deposit the sacrificial spacer 302. According to an exemplary embodiment, sacrificial spacer 302 has a thickness of from about 2 nm to about 10 nm and ranges therebetween. As its name implies, sacrificial spacer 302 will be removed later on in the process and replaced with a 'replacement' gate spacer alongside the sacrificial gates 202 (see below).

Figure 4A:
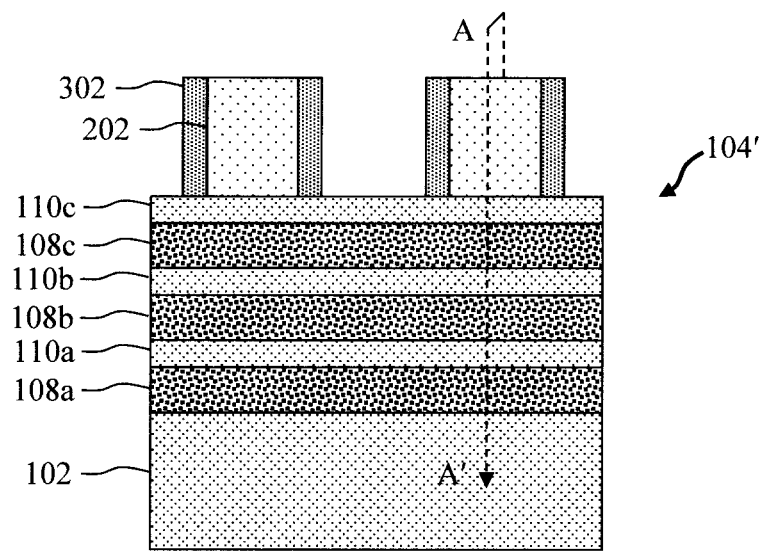
FIG. 4A is a cross-sectional diagram illustrating an etch back of the sacrificial spacer having been performed.
Figure 4B:
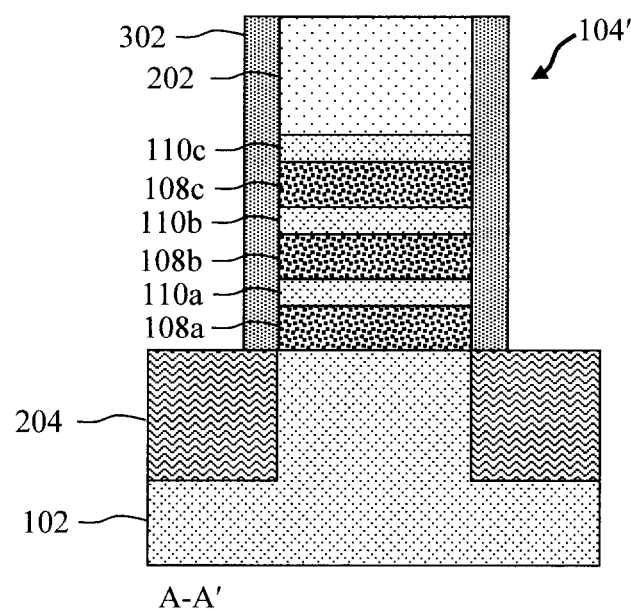
FIG. 4B is a cross-sectional diagram illustrating the etch back of the sacrificial spacer having been performed from a perpendicular cut A-A' through the structure of FIG. 4A according to an embodiment of the present invention.

An etch back of the sacrificial spacer 302 is then performed to remove the sacrificial spacer 302 from horizontal surfaces such as the top surface of the device stack 104' in between the sacrificial gates 202. See FIG. 4A and FIG. 4B. FIG. 4B depicts a cut along line A-A' through the structure shown in FIG. 4A. As shown in FIG. 4A, the cut along line A-A' is oriented into and out of the page (i.e., perpendicular to the view depicted in FIG. 4A). A directional (anisotropic) etching process such as RIE can be employed for the etch back of sacrificial spacer 302.

Figure 5A:
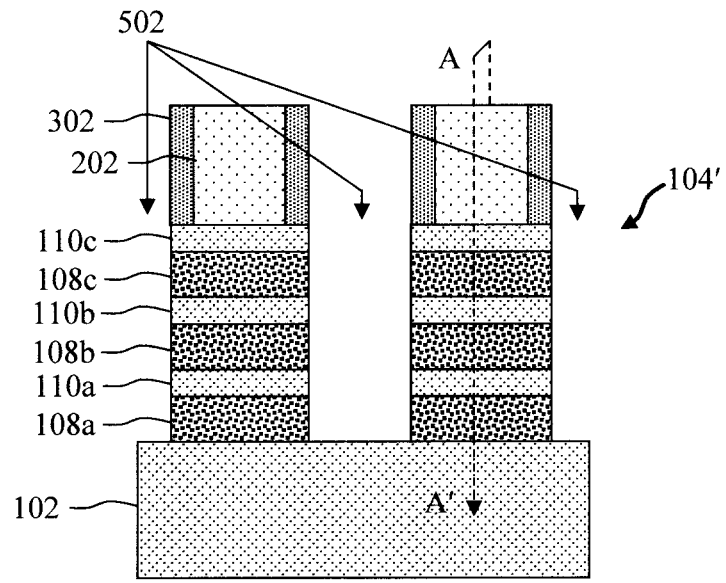
FIG. 5A is a cross-sectional diagram illustrating the sacrificial gates and spacer having been used as a mask to pattern trenches in the device stack in between the sacrificial gates.
Figure 5B:
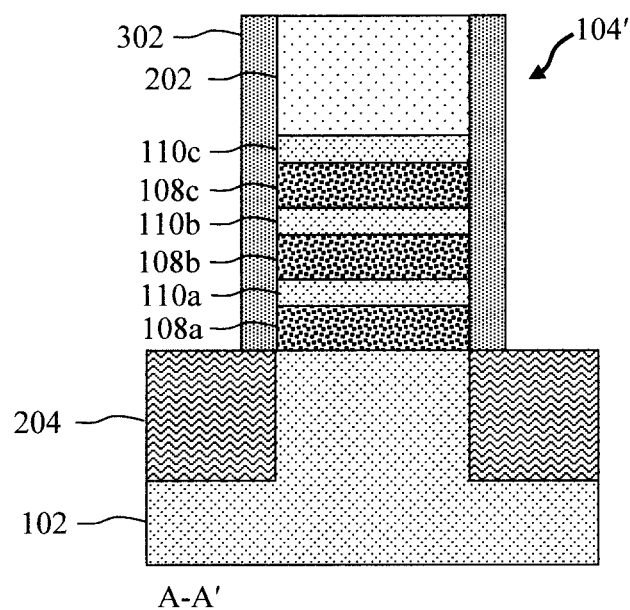
FIG. 5B is a cross-sectional diagram illustrating the sacrificial gates and spacer having been used as a mask to pattern the trenches in the device stack in between the sacrificial gates from a perpendicular cut A-A' through the structure of FIG. 5A according to an embodiment of the present invention.

Sacrificial gates 202 and sacrificial spacer 302 are then used as a mask to pattern trenches 502 in device stack 104' in between the sacrificial gates 202. See FIG. 5A and FIG. 5B. FIG. 5B depicts a cut along line A-A' through the structure shown in FIG. 5A. As shown in FIG. 5A, the cut along line A-A' is oriented into and out of the page (i.e., perpendicular to the view depicted in FIG. 5A). A directional (anisotropic) etching process such as RIE can be employed for the trench etch.

Figure 6A:
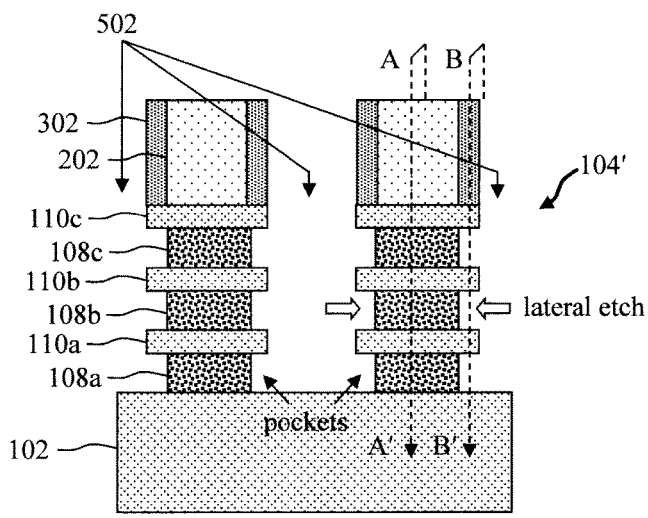
FIG. 6A is a cross-sectional diagram illustrating a selective lateral etch having been performed to recess the sacrificial layers forming pockets along the sidewalls of the trenches.
Figure 6B:
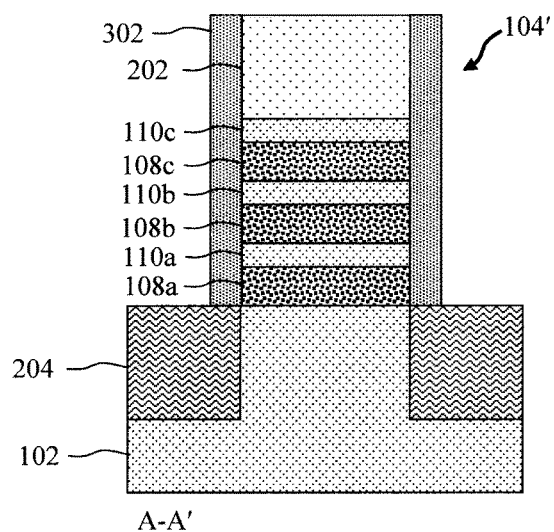
FIG. 6B is a cross-sectional diagram illustrating the selective lateral etch having been performed to recess the sacrificial layers forming the pockets along the sidewalls of the trenches from a perpendicular cut A-A' through the structure of FIG. 6A.
Figure 6C:
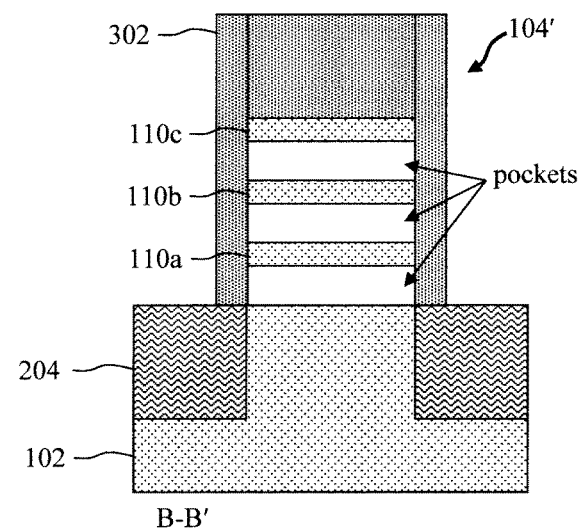
FIG. 6C is a cross-sectional diagram illustrating the selective lateral etch having been performed to recess the sacrificial layers forming the pockets along the sidewalls of the trenches from a perpendicular cut B-B' through the structure of FIG. 6A according to an embodiment of the present invention.

A selective lateral etch is then performed to recess the sacrificial layers 108a,b,c, etc. exposed along the sidewalls of trenches 502. See FIG. 6A, FIG. 6B, and FIG. 6C. FIG. 6B depicts a cut along line A-A' through the structure shown in FIG. 6A, and FIG. 6C depicts a cut along line B-B' through the structure shown in FIG. 6A. As shown in FIG. 6A, the cuts along line A-A' and line B-B' are oriented into and out of the page (i.e., perpendicular to the view depicted in FIG. 6A). As provided above, according to an exemplary embodiment, the sacrificial layers 108a,b,c, etc. are formed from SiGe. In that case, a SiGe-selective non-directional (isotropic) etching process can be used for the recess etch. This recess etch forms pockets along the sidewalls of the trenches 502. These pockets will be filled with the sacrificial semiconductor material such as high Ge content SiGe.

Figure 7A:
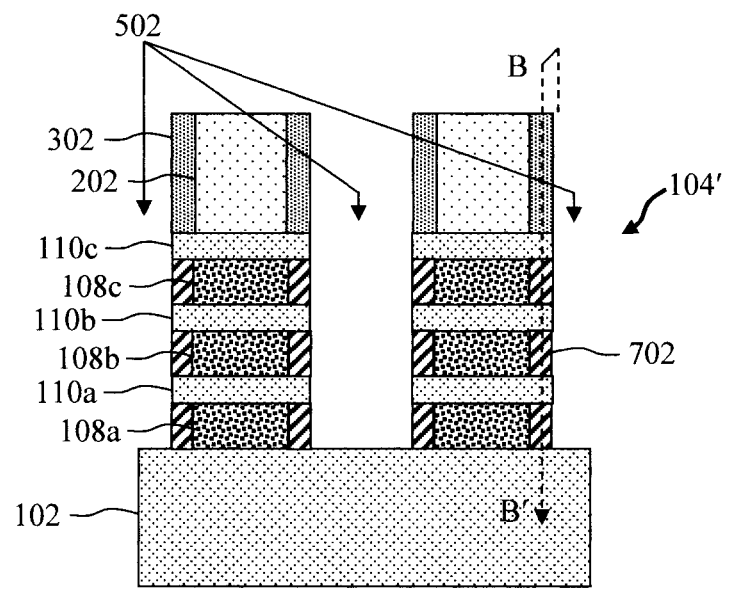
FIG. 7A is a cross-sectional diagram illustrating a sacrificial semiconductor material having been epitaxially grown back in the pockets.
Figure 7B:
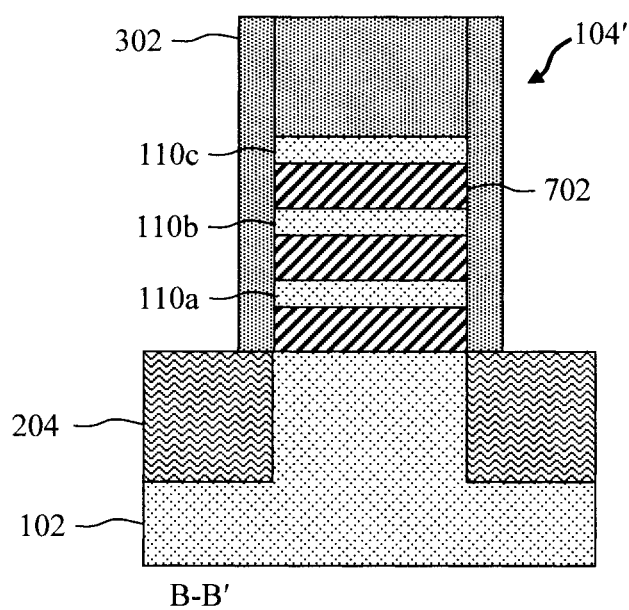
FIG. 7B is a cross-sectional diagram illustrating the sacrificial semiconductor material having been epitaxially grown back in the pockets from a perpendicular cut B-B' through the structure of FIG. 7A according to an embodiment of the present invention.
Figure 8:
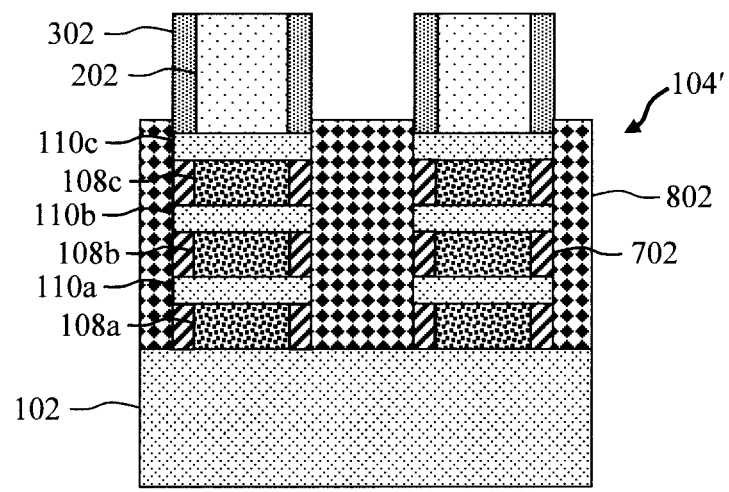
FIG. 8 is a cross-sectional diagram illustrating source/drains having been formed in the trenches on opposite sides of the sacrificial gates alongside the active layers and sacrificial semiconductor material according to an embodiment of the present invention.

Namely, sacrificial semiconductor material 702 is next epitaxially grown back in the pockets. See FIG. 7A and FIG. 7B. FIG. 7B depicts a cut along line B-B' through the structure shown in FIG. 7A. As shown in FIG. 7A, the cut along line B-B' is oriented into and out of the page (i.e., perpendicular to the view depicted in FIG. 7A). According to an exemplary embodiment, sacrificial semiconductor material 702 is a high Ge content SiGe, i.e., SiGe having from about 50% Ge to about 100% Ge (i.e., pure Ge) and ranges therebetween such as SiGe60. As provided above, sacrificial layers 108a,b,c, etc. can also be formed from SiGe. However, the SiGe in sacrificial layers 108a,b,c, etc. is a low Ge content SiGe, i.e., SiGe having from about 20% Ge to about 50% Ge and ranges therebetween such as SiGe30. Optionally, following growth, a recess etch of the sacrificial semiconductor material 702 can be performed to straighten the sidewalls of trenches 502. A directional (anisotropic) etching process such as RIE can be employed for the recess etch. As its name implies, sacrificial semiconductor material 702 will be removed later on in the process and replaced with a 'replacement' inner spacer alongside the device stack 104' (see below).

Notably, semiconductor (i.e., active layers 110a,b,c, etc. and sacrificial semiconductor material 702) is now present along the entire sidewall of trenches 502. This will enable the formation of low defect density and hence strained source/drain epitaxy (see below). The source/drain epitaxy will induce channel strain. Advantageously, channel strain enhances channel mobility and overall device performance. By comparison, with conventional process flows the pockets along the trench sidewall are typically filled with a dielectric material prior to the source/drain epitaxy. Thus, only a small area at the ends of the channel layers is exposed during the source/drain epitaxy which makes the epitaxial growth process difficult. As a result, the defect density in the source and drain epitaxy is high based on the different angle of epitaxy nucleation on the exposed ends of the channel layers. Source/drain epitaxy with a high defect density has little if no effect on inducing channel strain.

Source/drains 802 are then formed in the trenches 502 on opposite sides of the sacrificial gates 202 alongside the active layers 110a,b,c, etc. and sacrificial semiconductor material 702. See FIG. 8. According to an exemplary embodiment, source/drains 802 are formed from an in-situ doped (i.e., during growth) or ex-situ doped (e.g., via ion implantation) epitaxial material such as epitaxial Si, epitaxial SiGe, etc. Suitable n-type dopants include, but are not limited to, phosphorous (P), arsenic (As) and/or carbon (C). Suitable p-type dopants include, but are not limited to, boron (B). For instance, in one exemplary embodiment, the semiconductor FET device is an n-channel FET (NFET) and the source/drains 802 are formed from carbon and phosphorous-doped Si (Si:C(P)). In another exemplary embodiment, the semiconductor FET device is a p-channel FET (PFET) and the source/drains 802 are formed from boron-doped SiGe (SiGe:B).

Advantageously, only semiconductor (i.e., active layers 110a,b,c, etc. and sacrificial semiconductor material 702) are present along the entire sidewall of trenches 502 from which growth of the source/drains 802 is templated. As provided above, this will enable the formation of low defect density and hence strained source/drain 802 epitaxy. For instance, according to an exemplary embodiment, source/drains 802 have a defect density of less than or equal to about $2 \times 10^7$ cm$^{-2}$, for example, from about $1 \times 10^7$ cm$^{-2}$ to about $2 \times 10^7$ cm$^{-2}$ and ranges therebetween. As such, the source/drains 802 will induce channel strain and thereby enhance channel mobility and overall device performance. Namely, with more surface area for the epitaxy nucleation, defects like stacking faults will be much less. In the present process flow, growth of the source/drains 802, the whole sidewall of trenches 502 is semiconductor (i.e., active layers 110a,b,c, etc. and sacrificial semiconductor material 702), which provides a much larger area for epitaxy growth. The strain introduced by SiGe can be greatly relaxed by epitaxy defects. In standard flows with inner spacer processes, due to the limited exposed Si tip area, there is almost no strain due to the high defectivity. However, by way of the present process, due to less defects, the strain can be improved.

Figure 9A:
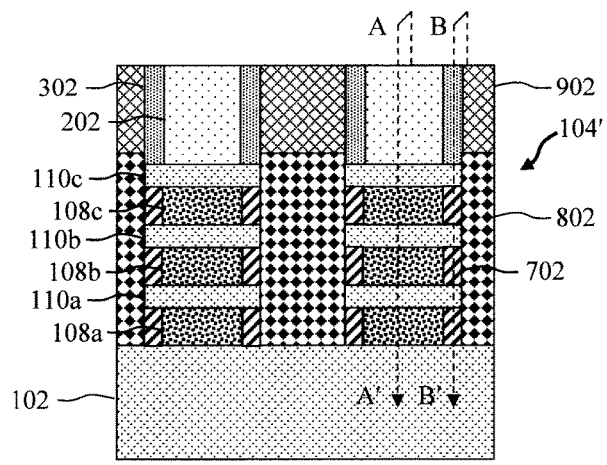
FIG. 9A is a cross-sectional diagram illustrating an interlayer dielectric (ILD) having been deposited onto and surrounding the device stack and the sacrificial gates/sacrificial spacer.
Figure 9B:
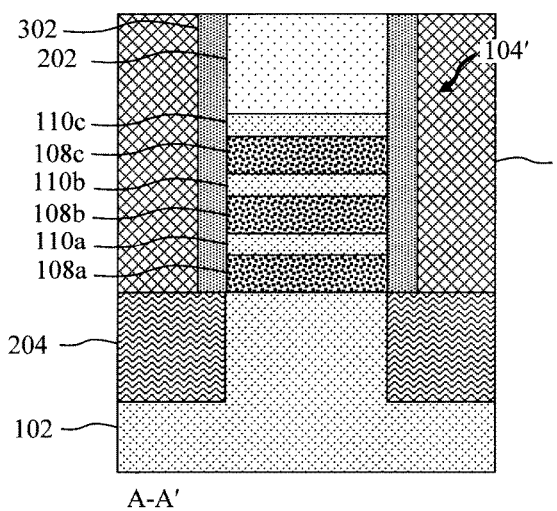
FIG. 9B is a cross-sectional diagram illustrating the ILD having been deposited onto and surrounding the device stack and the sacrificial gates/sacrificial spacer from a perpendicular cut A-A' through the structure of FIG. 9A.
Figure 9C:
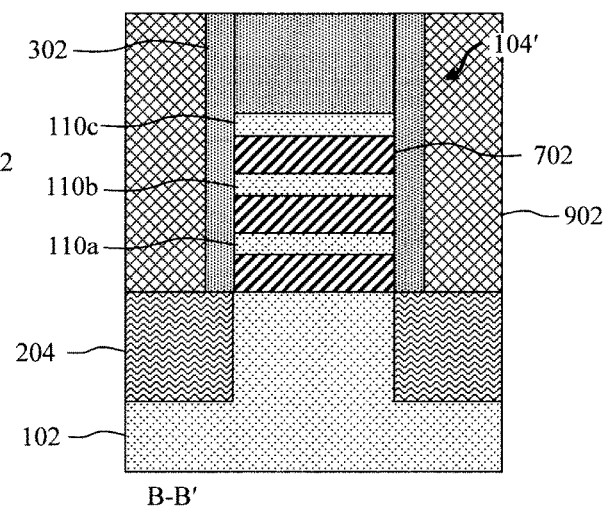
FIG. 9C is a cross-sectional diagram illustrating the ILD having been deposited onto and surrounding the device stack and the sacrificial gates/sacrificial spacer from a perpendicular cut B-B' through the structure of FIG. 9A according to an embodiment of the present invention.

An interlayer dielectric (ILD) 902 is then deposited onto and surrounding the device stack 104' and the sacrificial gates 202/sacrificial spacer 302. See FIG. 9A, FIG. 9B, and FIG. 9C. FIG. 9B depicts a cut along line A-A' through the structure shown in FIG. 9A, and FIG. 9C depicts a cut along line B-B' through the structure shown in FIG. 9A. As shown in FIG. 9A, the cuts along line A-A' and line B-B' are oriented into and out of the page (i.e., perpendicular to the view depicted in FIG. 9A). Suitable ILD materials include, but are not limited to, oxide low-κ materials such as SiOx and/or oxide ULK-ILD materials such as pSiCOH. A process such as CVD, ALD or PVD can be employed to deposit ILD 902. Following deposition, ILD 902 can be planarized using a process such as CMP, stopping on the sacrificial gates 202/sacrificial spacer 302.

Figure 10A:
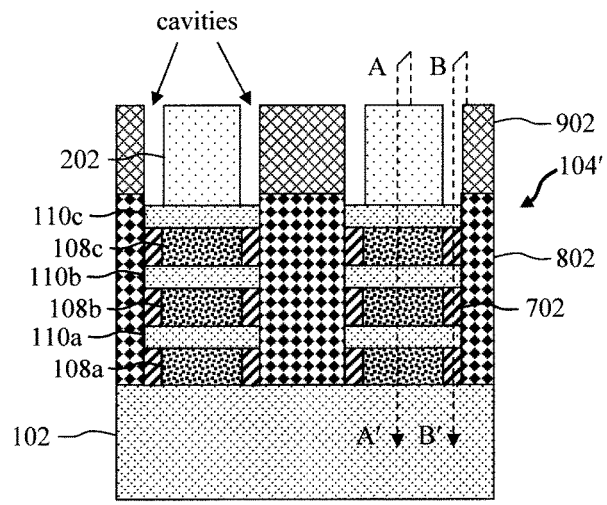
FIG. 10A is a cross-sectional diagram illustrating the sacrificial spacer having been selectively removed, forming cavities alongside the device stack and sacrificial gates.
Figure 10B:
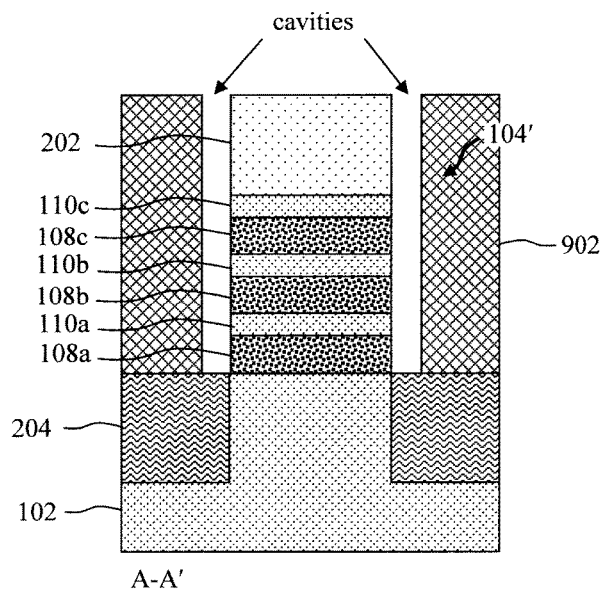
FIG. 10B is a cross-sectional diagram illustrating the sacrificial spacer having been selectively removed, forming the cavities alongside the device stack and sacrificial gates from a perpendicular cut A-A' through the structure of FIG. 10A.
Figure 10C:
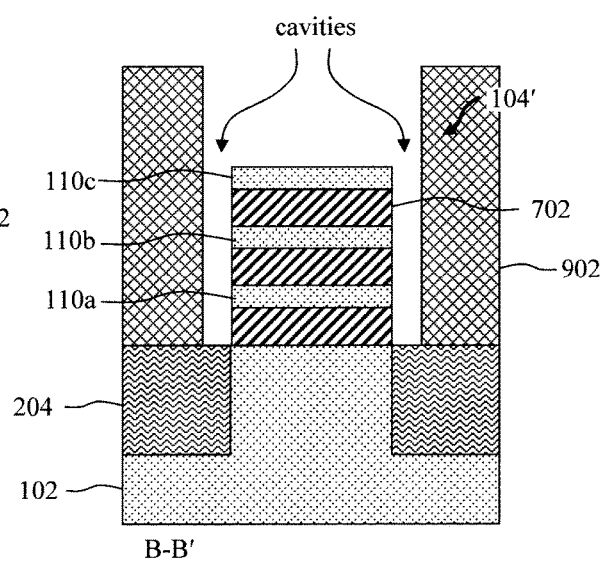
FIG. 10C is a cross-sectional diagram illustrating the sacrificial spacer having been selectively removed, forming the cavities alongside the device stack and sacrificial gates from a perpendicular cut B-B' through the structure of FIG. 9A according to an embodiment of the present invention.

The sacrificial spacer 302 is then selectively removed, forming cavities alongside the device stack 104' and sacrificial gates 202. See FIG. 10A, FIG. 10B, and FIG. 10C. FIG. 10B depicts a cut along line A-A' through the structure shown in FIG. 10A, and FIG. 10C depicts a cut along line B-B' through the structure shown in FIG. 10A. As shown in FIG. 10A, the cuts along line A-A' and line B-B' are oriented into and out of the page (i.e., perpendicular to the view depicted in FIG. 10A). As provided above, sacrificial spacer 302 can be formed from a nitride material such as SiN, SiON and/or SiCN. In that case, a nitride-selective isotropic etching process such as a wet chemical etch can be employed to remove the sacrificial spacer 302.

Figure 11A:
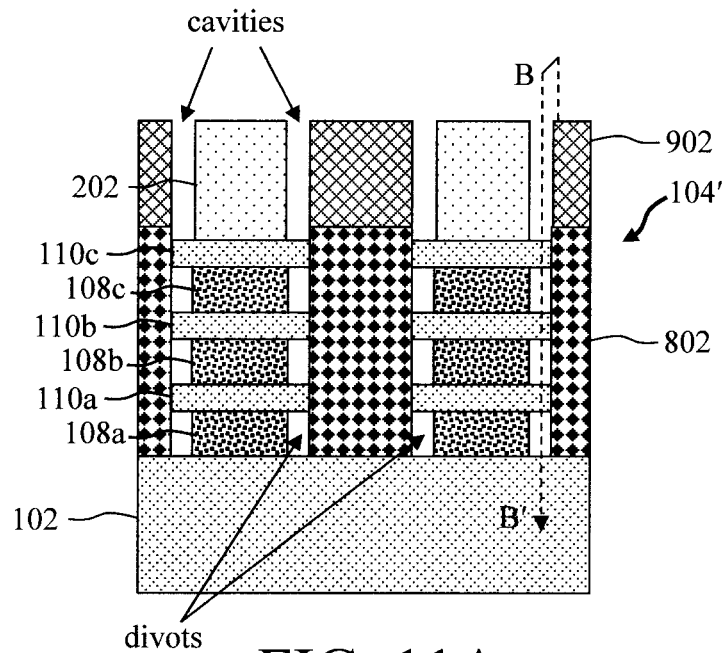
FIG. 11A is a cross-sectional diagram illustrating the sacrificial semiconductor material having been removed through the cavities forming divots alongside the sacrificial layers.
Figure 11B:
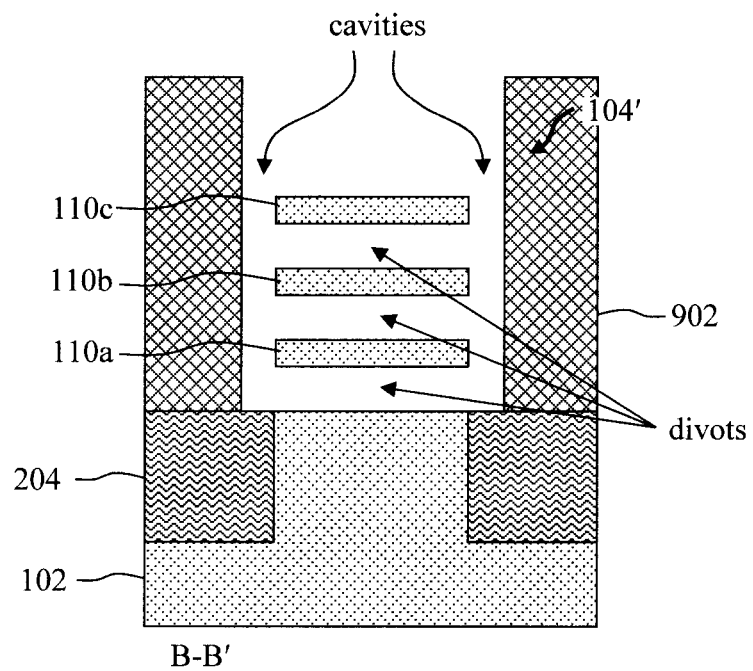
FIG. 11B is a cross-sectional diagram illustrating the sacrificial semiconductor material having been removed through the cavities forming the divots alongside the sacrificial layers from a perpendicular cut B-B' through the structure of FIG. 11A according to an embodiment of the present invention.

The sacrificial semiconductor material 702 exposed with the cavities is then removed through the cavities. See FIG. 11A and FIG. 11B. FIG. 11B depicts a cut along line B-B' through the structure shown in FIG. 11A. As shown in FIG. 11A, the cut along line B-B' is oriented into and out of the page (i.e., perpendicular to the view depicted in FIG. 11A). Removal of the sacrificial semiconductor material 702 forms divots alongside the sacrificial layers 108a,b,c, etc. As provided above, sacrificial semiconductor material 702 can be a high Ge content SiGe, i.e., SiGe having from about 50% Ge to about 100% Ge (i.e., pure Ge) and ranges therebetween such as SiGe60. While sacrificial layers 108a,b,c, etc. can also be formed from SiGe, the SiGe in sacrificial layers 108a,b,c, etc. is a low Ge content SiGe, i.e., SiGe having from about 20% Ge to about 50% Ge and ranges therebetween such as SiGe30. In that case, a high Ge content SiGe (such as sacrificial semiconductor material 702) can be removed selective to low Ge content SiGe (such as in sacrificial layers 108a,b,c, etc.) using an etchant such as dry HCl.

Figure 12A:
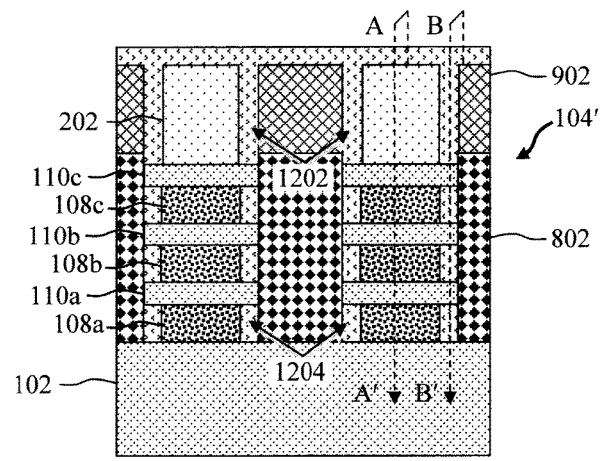
FIG. 12A is a cross-sectional diagram illustrating a spacer material having been deposited into the cavities and divots to form replacement gate spacers in the cavities and replacement inner spacers in the divots.
Figure 12B:
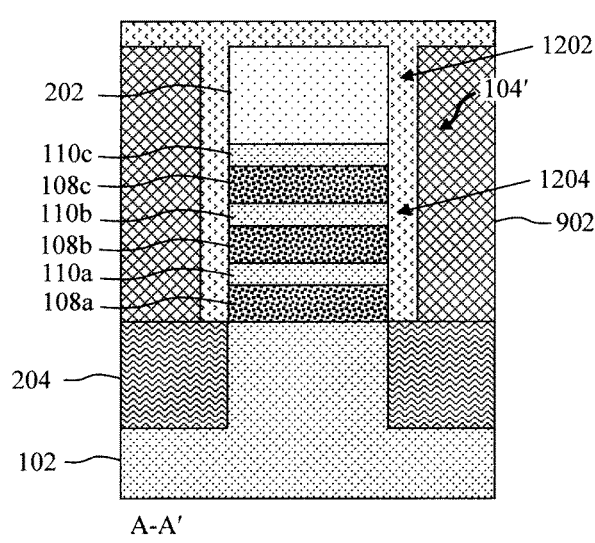
FIG. 12B is a cross-sectional diagram illustrating the spacer material having been deposited into the cavities and divots to form the replacement gate spacers in the cavities and the replacement inner spacers in the divots from a perpendicular cut A-A' through the structure of FIG. 12A.
Figure 12C:
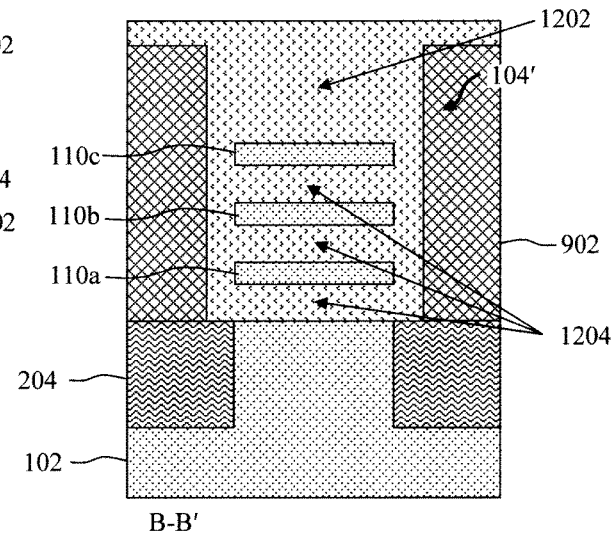
FIG. 12C is a cross-sectional diagram illustrating the spacer material having been deposited into the cavities and divots to form the replacement gate spacers in the cavities and the replacement inner spacers in the divots from a perpendicular cut B-B' through the structure of FIG. 12A according to an embodiment of the present invention.

A suitable spacer material is then deposited into the cavities and divots to form replacement gate spacers 1202 (in the cavities) alongside the sacrificial gates 202 and replacement inner spacers 1204 (in the divots) alongside the device stack 104'. See FIG. 12A, FIG. 12B, and FIG. 12C. FIG. 12B depicts a cut along line A-A' through the structure shown in FIG. 12A, and FIG. 12C depicts a cut along line B-B' through the structure shown in FIG. 12A. As shown in FIG. 12A, the cuts along line A-A' and line B-B' are oriented into and out of the page (i.e., perpendicular to the view depicted in FIG. 12A). Suitable spacer materials include, but are not limited to, SiOx, silicon carbide (SiC), silicon oxycarbide (SiCO) and/or SiN. A process such as ALD can be employed to deposit the spacer material into the divots and cavities. As highlighted above, this process is also referred to herein as a 'spacer-last' process, whereby the sacrificial spacer 302 and sacrificial semiconductor material 702 placed earlier on in the process are now replaced with the final replacement gate spacers 1202 and replacement inner spacers 1204 of the semiconductor FET device, respectively. It is further notable that, based on this spacer-last process, final replacement gate spacers 1202 and replacement inner spacers 1204 are formed at the same time and from the same material. This is not the case with conventional flows, where inner spacers are formed prior to source/drain epitaxy and separately from the gate spacers. Forming the final replacement gate spacers 1202 and replacement inner spacers 1204 at the same time and from the same material is advantageous because doing so improves the spacer quality and provides for a uniform spacer, rather than two materials used for the gate and inner spacer.

Following deposition, the spacer material is planarized using a process such as CMP, stopping on the sacrificial gates 202 and ILD 902. See FIG. 13A, FIG. 13B, and FIG. 13C. FIG. 13B depicts a cut along line A-A' through the structure shown in FIG. 13A, and FIG. 13C depicts a cut along line B-B' through the structure shown in FIG. 13A. As shown in FIG. 13A, the cuts along line A-A' and line B-B' are oriented into and out of the page (i.e., perpendicular to the view depicted in FIG. 13A).

Figure 14A:
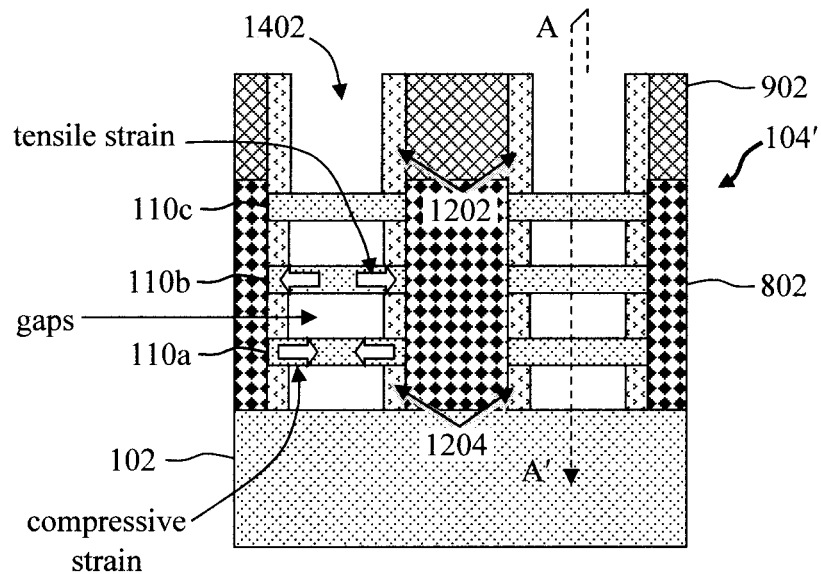
FIG. 14A is a cross-sectional diagram illustrating the sacrificial gates having been selectively removed forming gate trenches in the ILD over the device stack, and the sacrificial layers having been selectively removed forming gaps in the device stack in between the active layers.
Figure 14B:
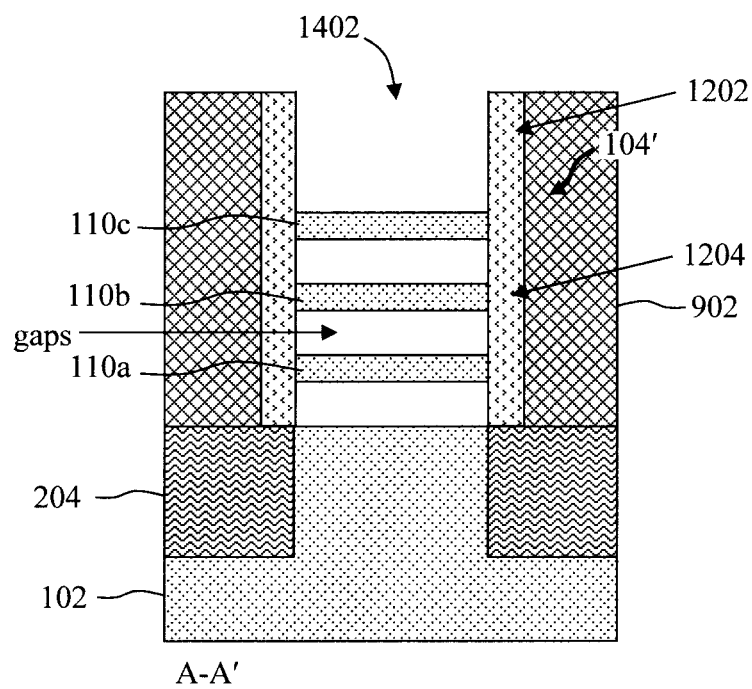
FIG. 14B is a cross-sectional diagram illustrating the sacrificial gates having been selectively removed forming the gate trenches in the ILD over the device stack, and the sacrificial layers having been selectively removed forming the gaps in the device stack in between the active layers from a perpendicular cut A-A' through the structure of FIG. 14A according to an embodiment of the present invention.

Sacrificial gates 202 are then selectively removed forming gate trenches 1402 in the ILD 902 over the device stack 104' in between the source/drains 802. The sacrificial layers 108a,b,c, etc., now accessible through gate trenches 1402, are then also selectively removed. Removal of sacrificial layers 108a,b,c, etc. releases the active layers 110a,b,c, etc. from device stack 104' in the channel region of the semiconductor FET device. Namely, the sacrificial layers 108a,b,c, etc. are present above and below the active layers 110a,b,c, etc. in device stack 104', thereby constraining the active layers 110a,b,c, etc. Thus, by 'released from the device stack' it is meant that the removal of the sacrificial layers 108a,b,c, etc. removes the constraints from the active layers 110a,b,c, etc. of being contained in the intact device stack 104'. Gaps are now present in device stack 104' in between the active layers 110a,b,c, etc. in the channel region of the semiconductor FET device. See FIG. 14A and FIG. 14B. FIG. 14B depicts a cut along line B-B' through the structure shown in FIG. 14A. As shown in FIG. 14A, the cut along line B-B' is oriented into and out of the page (i.e., perpendicular to the view depicted in FIG. 14A). Active layers 110a,b,c, etc. will be used to form the channels of the semiconductor FET device. As will be described in detail below, replacement metal gates, i.e., including a gate dielectric and at least one workfunction-setting metal, will be formed in the gate trenches 1402 and the gaps that fully surround a portion of each of the active layers 110a,b,c, etc. in a gate-all-around (GAA) configuration.

Notably, as provided above, the source/drains 802 are formed from a low defect density (i.e., source/drains 802 have a defect density of less than or equal to about 2×10$^7$ cm$^{-2}$, for example, from about 1×10$^7$ cm$^{-2}$ to about 2×10$^7$ cm$^{-2}$ and ranges therebetween) and hence strained epitaxy. Release of the active layers 110a,b,c, etc. from device stack 104' enables that strain from source/drains 802 to be fully imparted on the active (channel) layers 110a,b,c, etc. Channel strain desirably enhances channel mobility and overall device performance. The strain induced on the active layers 110a,b,c, etc. by source/drains 802 can be compressive or tensile. For instance, for PFETs SiGe (see above) can be employed for compressive strain introduction. For NFETs, Si:C (see above) can be employed to have tensile strain.

Figure 15A:
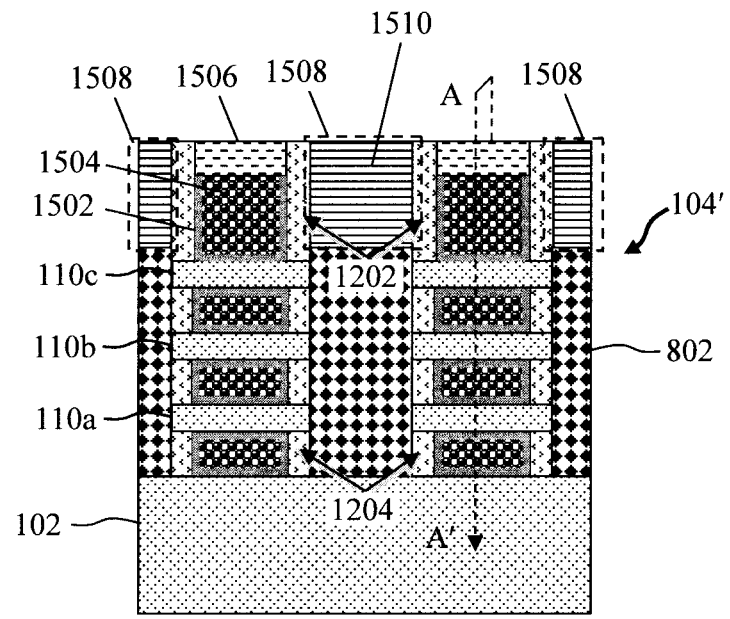
FIG. 15A is a cross-sectional diagram illustrating replacement metal gates having been formed in the gate trenches and gaps, dielectric caps having been formed over the replacement metal gates, and source/drain contacts having been formed.
Figure 15B:
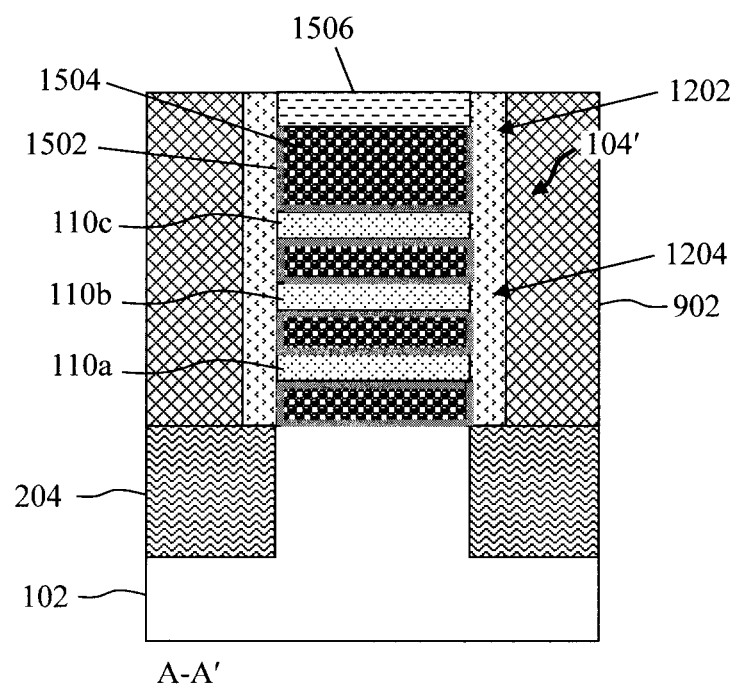
FIG. 15B is a cross-sectional diagram illustrating the replacement metal gates having been formed in the gate trenches and gaps, and the dielectric caps having been formed over the replacement metal gates from a perpendicular cut A-A' through the structure of FIG. 15A according to an embodiment of the present invention.

Formation of the replacement metal gates begins with the deposition of a conformal gate dielectric 1502 into and lining each of the gate trenches 1402 and gaps, with the conformal gate dielectric 1502 being disposed on the active layers 110a,b,c, etc. in the channel region of the semiconductor FET device. At least one workfunction-setting metal 1504 is then deposited into the gate trenches 1402 and gaps over the gate dielectric 1502. See FIG. 15A and FIG. 15B. FIG. 15B depicts a cut along line A-A' through the structure shown in FIG. 15A. As shown in FIG. 15A, the cut along line A-A' is oriented into and out of the page (i.e., perpendicular to the view depicted in FIG. 15A).

According to an exemplary embodiment, gate dielectric 1502 is a high-κ material. The term "high-κ," as used herein, refers to a material having a relative dielectric constant κ which is much higher than that of silicon dioxide (e.g., a dielectric constant κ=25 for hafnium oxide (HfO$_2$) rather than 4 for SiO$_2$). Suitable high-κ gate dielectrics include, but are not limited to, HfO$_2$ and/or lanthanum oxide (La$_2$O$_3$). A process such as CVD, ALD or PVD can be employed to deposit the gate dielectric 1502 into the gate trenches 1402 and gaps. According to an exemplary embodiment, gate dielectric 1502 has a thickness of from about 1 nanometer (nm) to about 5 nm and ranges therebetween. A reliability anneal can be performed following deposition of gate dielectric 1502. In one exemplary embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as nitrogen.

A process such as CVD, ALD or PVD can be employed to deposit the workfunction-setting metal(s) 1504, after which the metal overburden can be removed using a process such as CMP. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above. Now present is a structure including device stack(s) 104' with active layers 110a,b,c, etc. oriented horizontally one on top of another on substrate 102, at least one gate (i.e., replacement metal gates—gate dielectric 1502 and workfunction-setting metal(s) 1504) surrounding at least a portion of each of active layers 110a,b,c, etc. in a GAA configuration, gate spacers 1202 alongside the gates, and source/drains 802 on opposite sides of the gates.

The gate dielectric 1502 and workfunction-setting metal (s) 1504 are recessed, and dielectric caps 1506 are formed in gate trenches 1402 over the (recessed) gate dielectric 1502 and workfunction-setting metal(s) 1504. Suitable materials for dielectric caps 1506 include, but are not limited to, SiOx and/or SiN. A process such as CVD, ALD or PVD can be employed to deposit the dielectric cap material into gate trenches 1402, after which the material can be planarized using a process such as CMP.

The dielectric caps 1506 serve to protect the underlying replacement metal gates (i.e., gate dielectric 1502 and workfunction-setting metal(s) 1504) during source/drain contact formation. During source/drain contact formation, the ILD 902 is fully removed from the top of the source/drains 802 forming contact trenches (illustrated by dashed lines 1508) over the source/drains 802. A contact metal (or combination of contact metals) is/are then deposited into and filling the contact trenches, forming source/drain contacts 1510 over the source/drains 802. Suitable contact metals include, but are not limited to, copper (Cu), tungsten (W), ruthenium (Ru), cobalt (Co), nickel (Ni) and/or platinum (Pt). The contact metal(s) can be deposited into the contact trenches using a process such as evaporation, sputtering, or electrochemical plating. Following deposition, the overburden can be removed using a process such as CMP.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A semiconductor field-effect transistor (FET) device, comprising:
   a substrate;
   at least one device stack comprising active layers oriented horizontally one on top of another on the substrate;
   shallow trench isolation regions in the substrate at a base of the at least one device stack, wherein a topmost surface of the substrate is coplanar with a topmost surface of the shallow trench isolation regions;
   gates surrounding at least a portion of each of the active layers in a gate-all-around configuration, wherein the gates directly contact the substrate in between the shallow trench isolation regions;
   gate spacers alongside the gates;
   dielectric caps disposed over the gates, wherein the dielectric caps are present in between the gate spacers, with a top surface of the dielectric caps being coplanar with a top surface of the gate spacers;
   source/drains, interconnected by the active layers, on opposite sides of the gates, wherein:
      the source/drains and the gates are disposed on a same topmost surface of the substrate;
      the source/drains are offset from the gates by inner spacers which share common straight, vertical sidewalls with opposing ends of the active layers;
      a bottom surface of the source/drains is coplanar with a bottom surface of the gates;
      the source/drains comprise an epitaxial material having a low defect density which induces strain in the active layers;

the gate spacers and the inner spacers are formed from a same material disposed as a continuous layer that surrounds each of the active layers;

a bottom surface of the inner spacers is in direct contact with the same topmost surface of the substrate in a first cross-section of the semiconductor FET device; and the bottom surface of the inner spacers is in direct contact with the shallow trench isolation regions in a second cross-section of the semiconductor FET device that is: (i) perpendicular to the first cross-section of the semiconductor FET device, and (ii) intersects the gates; and source/drain contacts over the source/drains, wherein each source/drain contact is offset from the gates by the gate spacers which share common straight, vertical sidewalls with opposing ends of the active layers.

2. The semiconductor FET device of claim 1, wherein the low defect density comprises a defect density of less than or equal to about $2\times10^7$ $cm^{-2}$.

3. The semiconductor FET device of claim 2, wherein the epitaxial material is selected from the group consisting of: carbon and phosphorus-doped silicon (Si:C(P)) and boron-doped silicon germanium (SiGe:B).

4. The semiconductor FET device of claim 1, wherein the gate spacers and the inner spacers are formed from a material selected from the group consisting of: silicon carbide (SiC) and silicon oxycarbide (SiCO).

5. The semiconductor FET device of claim 1, wherein the strain induced in the active layers comprises compressive strain.

6. The semiconductor FET device of claim 1, wherein the strain induced in the active layers comprises tensile strain.

7. The semiconductor FET device of claim 1, wherein the inner spacers share the common straight, vertical sidewalls with both the opposing ends of the active layers and the gate spacers.

8. The semiconductor FET device of claim 1, wherein the gates directly contact the topmost surface of the substrate.

9. A semiconductor FET device, comprising:

a substrate;

at least one device stack comprising active layers oriented horizontally one on top of another on the substrate;

shallow trench isolation regions in the substrate at a base of the at least one device stack, wherein a topmost surface of the substrate is coplanar with a topmost surface of the shallow trench isolation regions;

gates surrounding at least a portion of each of the active layers in a gate-all-around configuration, wherein the gates directly contact the substrate in between the shallow trench isolation regions;

gate spacers alongside the gates;

dielectric caps disposed over the gates, wherein the dielectric caps are present in between the gate spacers, with a top surface of the dielectric caps being coplanar with a top surface of the gate spacers;

source/drains, interconnected by the active layers, on opposite sides of the gates, wherein:

the source/drains and the gates are disposed on a same topmost surface of the substrate;

the source/drains are offset from the gates by inner spacers which share common straight, vertical sidewalls with opposing ends of the active layers;

a bottom surface of the source/drains is coplanar with a bottom surface of the gates;

the source/drains comprise an epitaxial material having a low defect density from about $1\times10^7$ $cm^{-2}$ to about $2\times10^7$ $cm^{-2}$ and ranges therebetween which induces strain in the active layers;

the gate spacers and the inner spacers are formed from a same material disposed as a continuous layer that surrounds each of the active layers;

a bottom surface of the inner spacers is in direct contact with the same topmost surface of the substrate in a first cross-section of the semiconductor FET device; and the bottom surface of the inner spacers is in direct contact with the shallow trench isolation regions in a second cross-section of the semiconductor FET device that is: (i) perpendicular to the first cross-section of the semiconductor FET device, and (ii) intersects the gates; and source/drain contacts over the source/drains, wherein each source/drain contact is offset from the gates by the gate spacers which share common straight, vertical sidewalls with opposing ends of the active layers.

10. The semiconductor FET device of claim 9, wherein the gate spacers and the inner spacers are formed from a material selected from the group consisting of SiC and SiCO.

11. The semiconductor FET device of claim 9, wherein the epitaxial material is selected from the group consisting of: Si:C(P) and SiGe:B.

12. The semiconductor FET device of claim 9, wherein the strain induced in the active layers is of a type selected from the group consisting of: compressive strain and tensile strain.

* * * * *